United States Patent [19]
Hibbard et al.

[11] Patent Number: 6,013,911
[45] Date of Patent: Jan. 11, 2000

[54] LAMP ILLUMINATION CONTROL SYSTEM AND METHOD

[75] Inventors: Earl Roger Hibbard, Arroyo Grande; James A. Cashin; Gordon Henry Jennings, III, both of San Luis Obispo; Bevan Wright, La Palma; Steinar Larsen, Los Angeles, all of Calif.

[73] Assignees: Ultra Stereo Labs Inc., San Luis Obispo; Christie, Inc., Cypress, both of Calif.

[21] Appl. No.: 09/033,463

[22] Filed: Mar. 2, 1998

[51] Int. Cl.⁷ .............................. G01J 1/32; G03B 21/32
[52] U.S. Cl. ............................................. 250/205; 353/87
[58] Field of Search .............................. 250/205; 352/41; 315/149, 158; 353/87

[56] References Cited

U.S. PATENT DOCUMENTS

| | | |
|---|---|---|
| 715,702 | 12/1902 | Spangemberg . |
| 1,000,964 | 8/1911 | Crosier . |
| 1,133,412 | 3/1915 | Stone . |
| 1,270,269 | 6/1918 | Davis . |
| 1,295,522 | 2/1919 | Kirby, Jr. . |
| 1,375,089 | 4/1921 | Granz . |
| 1,403,863 | 1/1922 | Peat . |
| 1,496,427 | 6/1924 | Nelson . |
| 1,549,530 | 9/1925 | Freeze . |
| 1,667,380 | 4/1928 | Handlan . |
| 1,747,279 | 2/1930 | Andreino . |
| 1,762,877 | 6/1930 | Moreton . |
| 1,792,475 | 2/1931 | Anderson . |
| 2,431,575 | 11/1947 | McCune ................................. 356/218 |
| 2,831,054 | 4/1958 | Harris ..................................... 356/218 |
| 3,095,155 | 6/1963 | Schleifer . |
| 3,679,903 | 7/1972 | Blitchington, Jr. ............. 250/83.3 UV |
| 3,700,884 | 10/1972 | Fujimoto ................................... 353/87 |
| 4,195,327 | 3/1980 | Piquot . |
| 4,196,459 | 4/1980 | Dick . |
| 4,212,050 | 7/1980 | Trenkler . |
| 4,233,657 | 11/1980 | deMey, II . |
| 4,306,279 | 12/1981 | Cohen . |
| 4,336,571 | 6/1982 | Marchand . |
| 4,386,391 | 5/1983 | Gulliksen et al. . |
| 4,583,152 | 4/1986 | Kawai et al. . |
| 4,628,414 | 12/1986 | Ricard . |
| 4,674,013 | 6/1987 | Manzoni . |
| 4,709,306 | 11/1987 | Harris et al. . |
| 4,712,167 | 12/1987 | Gordin et al. . |
| 4,882,658 | 11/1989 | Allen . |
| 4,890,207 | 12/1989 | Jones . |
| 5,067,811 | 11/1991 | Ouchi ..................................... 356/121 |
| 5,164,785 | 11/1992 | Hopkins et al. . |
| 5,426,500 | 6/1995 | Ohana . |

*Primary Examiner*—Edward P. Westin
*Assistant Examiner*—Glenn T Kinnear
*Attorney, Agent, or Firm*—Andra M. Vaccaro

[57] ABSTRACT

The present invention is a system and method to quickly and accurately measure the luminance and luminance distribution of a light on the surface of an object so that the position of the lamp can be adjusted relative to the projector optics to obtain the best luminance available for that object. A scanning light receiver, which produces an optical image of the object whose luminance is to be tested, is set up so that it may view a substantial portion of the surface of the object. The light receiver is connected to a analyzer and control unit ("ACU") to which it sends an electronic image representing the reflected luminance of the surface during each scan. The reflected light that is detected by the light receiver is then analyzed by the ACU to determine the luminance levels and distribution across a substantial portion of the surface by measuring the voltage of each pixel detected by the light receiver measured against the voltage produced by a black level. Once this analysis is complete, the ACU sends the results to a driver interface unit which is connected to a light source position controller in the projector which continuously adjusts the position of the light source relative to the projector optics until optimal luminance and luminance distribution is achieved across the viewing surface. For example, using the method and system of the present invention, the position of the lamp continually and automatically may be fine tuned until optimum luminance is achieved.

19 Claims, 3 Drawing Sheets

LAMP ILLUMINATION CONTROL SYSTEM AND METHOD

BACKGROUND OF THE INVENTION

1. Field of the Invention

The invention relates to control systems for automatically adjusting light sources within projectors so as to achieve optimum illumination across the surface on which the light is being projected.

2. Background of the Invention

Present day color film print stock is formulated to give best picture quality when the projection and screen system provide a maximum luminance of approximately 16 ft Lamberts. If less than maximum luminance is obtained, the screen will display a picture with color that appears dull and "washed-out". Conversely if excessive or inconsistent luminance is achieved, some viewers may notice a flicker in the brightness level. It is also important that the luminance is consistent across the entire screen area.

For example, it is well known in the motion picture art that a motion picture image on a film is projected onto a screen when a light passes through the film as it is being fed frame by frame through a projection device. Specifically, as a film is fed through a film projector, each film frame is advanced through a gate in the projector within approximately ten milliseconds. The frame is then held stationary in the projector's gate for approximately 30 milliseconds while the shutter opens twice so that the frame is exposed to two ten millisecond pulses of light. Thus, light pulses at a rate of 48 Hertz are projected through the film through a projection lens and then onto a movie screen to create a visible image. Each new frame is projected every one-twenty-fourth of a second.

A number of factors affect the consistency of the luminance emitted from the light source. Some of the most important factors are the alignment of the lamp (sometimes referred to as the "lamp house") with the projector optics; the adjustment of the light source optics; the luminous power output of the light source; and the quality of the projection lens.

Therefore, in order to obtain the best luminance available from the light source, adjustments of the position of the lamp within the lamp housing in the X, Y and Z axes must be achieved concurrently in a very short period of time.

Presently, there are several devices and methods that are used to measure and adjust the luminance level of the light source. For example, there is known in the prior art a device known as a "spotmeter," which can be used to manually measure the luminance level by taking a reading of the luminance usually at the center of the screen on which the light is being projected. The variations in the luminance level can be measured with the spotmeter by measuring the luminance levels at various other locations on the screen and comparing the measurements with the luminance level at the center of the screen. Any adjustments in the luminance must be made manually.

The spotmeter is similar to a light meter used in photography except that it measures the reflected fight rather than the incident light. The spotmeter is comprised of a photocell attached to a lens that measures the light in a 1° optical path. Thus, it can only view a small area at a time and must be manually moved in order to take measurements over a large area.

Another method used to measure the luminance of the projection system is where a technician uses his naked eye to review the luminance of a screen. However, the human eye is very poor at recognizing or measuring differences in luminance levels.

Another prior art device, the imaging spectroradiometer, described and disclosed in U.S. Pat. No. 5,424,543 issued on Jun. 13, 1995 to Mark Dombrowski, is an instrument that uses a CCD video camera for the purpose of creating spectral images of a scene. Displaying both spatial form and spectral radiance, the spectroradiometer allows acute discrimination of objects within the image. This instrument is designed to provide highly accurate images of a scene for analysis of objects within the scene, but has no means to measure the variation in luminance of motion picture images.

A further prior art device is described and disclosed in U.S. Pat. No. 5,239,174 issued on Aug. 24, 1993 to Raymond Klein entitled "Spectral intensity measuring system for measuring repetitively pulsed light having a multichannel detector array and adjustment system including a digital phase locked loop." In this patent, a measuring system is disclosed that measures the incident light emitted from a light source such as a xenon light, a flourescent lamp or a CRT. It performs this measurement by synchronizing the peak amplitude of a pulsed light source with the amplitude of a multichannel array spectroradiometer before measuring the incident light. The accuracy of the measurement is wholly dependent on the synchronization, such that a tight synchronization must be maintained at all times. While with the proper optics, this prior art system could possibly measure the average reflected light from a movie screen, it would not be able to differentiate between luminance measurements at various locations on the screen.

Since adjustments often need to be made to the lamphouse optics in movie projectors, for example, after replacement of a bulb, recalibration of the luminance pattern using the devices and methods known in the prior art can be a tedious process and often results in a less than optimum light pattern on the screen.

Specifically, in the prior art, the film projector is mounted on a console and carries a lens turret and one or more motors for changing lenses and film aperture. The console which carries the projector includes the projection lamp, reflector, heat filter, lamp power supply, optical system and control panel. The projector has various aperture shapes that are used in connection with present day film. In one arrangement, two apertures are used; one aperture is long horizontally and narrow vertically (sometimes referred to as the Cinemascope or "scope" aperture) and the other aperture is rectangular with a width to height ratio of 1.85 to 1 (sometimes referred to as the "flat" aperture).

The projector usually contains a light source such as a high intensity lamp or the like. Usually, the beam of light from the light source is circular causing some of the lamp's energy to be blocked by each of the apertures. Further, since the projector apertures have different length to width ratios, it is the practice in the prior art to focus the beam to a size which is a compromise between the preferred sizes of each of the two apertures. Alternatively in order to improve the luminance of the light source, the projector operator can manually change the focal point of the lamp. However, changing the focus is not a practical solution to the problem because an operator usually is not present in the projection booth at all times.

Therefore, there has been a long felt need to provide a means to easily, quickly and accurately measure the luminance of the projected light and thereby adjust the light source, so that optimal viewing of the surface onto which the light is being projected may be achieved.

A lamp mounting arrangement that is currently available which can semi-automatically or manually adjust the lamp position thereby causing the lamp focus and beam shape to achieve maximum efficiency for each of the aperture shapes is set forth in U.S. Pat. No. 5,054,909 issued to CHRISTIE INCORPORATED entitled LAMP HOUSING FOR MOTION PICTURE FILM PROJECTOR.

Likewise, the only instrument that is currently available that measures and controls several key performance parameters of motion picture presentations such as overall luminance (brightness of the screen image), low or imperceptible variations in the intensity of the luminance of the screen (otherwise known as "flicker"), and the amount of horizontal and vertical motion of an image that is being displayed on the screen (known respectively as "weave" and "jump" of the image) is set forth in U.S. Pat. No. 5,818,597 issued to Ultra Stereo Labs, Inc. entitled PROJECTION SYSTEM ANALYZER.

Therefore, in order to optimize the luminance of the light source, it would be advantageous to combine some of the features of a PROJECTION SYSTEM ANALYZER such as the one disclosed in the Ultra Stereo Labs, Inc. patent with a MOTORIZED LAMP HOUSING FOR MOTION PICTURE FILM PROJECTOR such as the one disclosed in the CHRISTIE INCORPORATED patent, each modified so that control signals from the PROJECTION SYSTEM ANALYZER automatically control and adjust the position of the lamp, so that optimal luminance and luminance distribution are achieved across the viewing surface.

One of the constraints that applies to automatic adjustment of the lamp is that the screen can only be illuminated for a very short period of time without the film running through the projector gate, The extremely high amount of light energy emitted by the lamp will heat the projector lens. Too much heat can fracture the lens. Thus, any adjustments to the lamp must be accomplished in a very small period of time.

SUMMARY OF THE INVENTION

The present invention is a system and method to quickly and accurately adjust the vertical centering of the light on a surface in such a manner so as not to crack or burn the optics on a projector.

The present invention also provides means to compensate for the vertical angle between the projector to screen light path and the screen to audience light path.

The present invention also provides means to measure and adjust the ratio of luminance in the corners of the viewing surface to the luminance at the center of the surface. Since the ratio differs from one venue to the next due to viewing surface size, light source power and other factors, the present invention provides a means to quickly and easily adjust the light source so as to maximize the luminance across a viewing surface.

For example, using the method and system of the present invention, the position of the lamp continuously and automatically may be fine tuned until optimum luminance is achieved.

The present invention fulfills a long felt need to provide a means to easily, quickly and accurately measure and adjust the luminance of light sources on a surface, such as a movie screen, so that optimal viewing of that surface may be achieved.

However, other applications for the invention are contemplated such as its use in X-Ray, video projection, high intensity light curing systems, semiconductor processing systems and other medical equipment in which a high intensity lamp is focused on an object or surface.

In the present invention, a motorized lamp housing for a motion picture film projector is utilized whereby a light is projected onto an object whose luminance is to be tested. The lamp housing provides control means for concurrently moving the lamp forward and backward, up and down, and side to side, in order to change the position of the lamp with respect to the focusing reflector and the film aperture. A remote electrical control means is also provided which automatically moves the lamp in the X, Y and Z axes, concurrently.

Specifically, the lamp housing is connected to a system controller that comprises a scanning light receiver, which produces a two dimensional optical image of the object whose luminance is to be tested. The scanning light receiver is set up so that it may view a substantial portion of the surface of an object. The light receiver is connected to a analyzer and control unit ("ACU") to which it sends an electronic image representing the reflected luminance of the surface of the object during each scan. The reflected light that is detected by the light receiver is then analyzed by the ACU to determine the optimal luminance levels across a substantial portion of the surface.

The ACU continuously and quickly analyzes the screen luminance pattern by measuring the voltage of each pixel detected by the light receiver measured against the voltage produced by a black level. As each analysis is complete, the ACU creates data representing the results of the scan which thereby is sent to the remote electrical control means in the lamp housing so that the position of the lamp continuously can be adjusted so as to achieve optimal luminance across the screen.

By using the system and method of the present invention, even low frequency variations in luminance of the light source can be detected, measured, analyzed and processed. Thus, by using the instrumentation and method of the present invention, the position of the lamp easily can be fine tuned so that the image that is to be viewed will be shown with the best luminance available.

Adjustments using the system and method of the present invention are usually much more accurate, can be adjusted to account for the screen flatness and the position of the projector as compared with the lighting receiver and requires much less time than using any of the devices and techniques known in the prior art. This is important as many of the projector light sources use high intensity light that can fracture or otherwise destroy the optics if it is focused there through without any shielding means such as film and the like.

DETAILED DESCRIPTION OF THE DRAWINGS

It is well known in the art that a motion picture image on a film is projected onto a screen when a light passes through the film as it is being fed frame by frame through a projection device. Specifically, as a film is fed through a film projector, each frame is pulled through a gate in the projector at a rate of approximately forty milliseconds for each frame. The frame is advanced in ten milliseconds and held stationary in the projector's gate for approximately thirty milliseconds while two pulses of light, usually at a rate of 48 Hertz are projected through the film and projection lens onto the movie screen to create a visible image.

While the light source is constant; the light emitted from the projector is not. A shutter in the projector interrupts the light path, twice for each frame for two 10 millisecond pulses of light or at a rate of 48 Hz.

However, for various reasons, such as misalignment of the lamp housing with the projector optics; replacement of the lamp, movement of the projector and the like, the luminance across a movie screen may become inconsistent.

If less than optimum luminance is obtained, the screen will display a picture with color that appears dull and "washed-out". Conversely if excessive or inconsistent luminance is achieved, some viewers may notice a change or "flicker" in the brightness level. Thus, it is important that the screen luminance is optimum and consistent across the entire screen area.

In addition, the lamp that is used within a projector is a high intensity lamp that emits a relatively large amount of energy. If the lamp is focused through the projector lens longer than the time it takes for a frame to pass through, there is a danger that the lens will crack or otherwise be destroyed. Therefore, the present invention provides a method for measuring and adjusting the position of the lamp to achieve optimal luminance across the screen.

Figure 1:
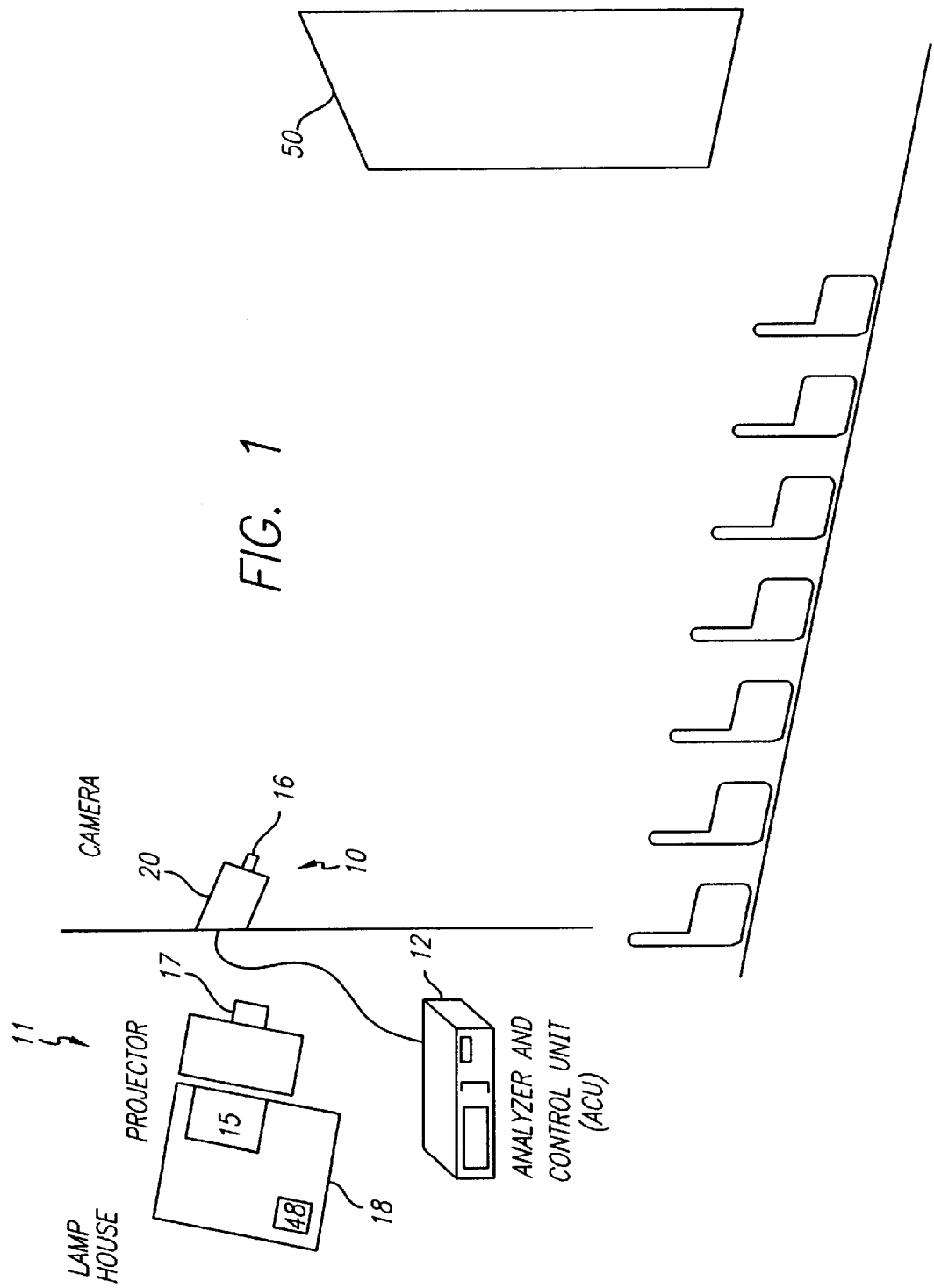
FIG. 1 is a block diagram of the system of the present invention.
Figure 3:
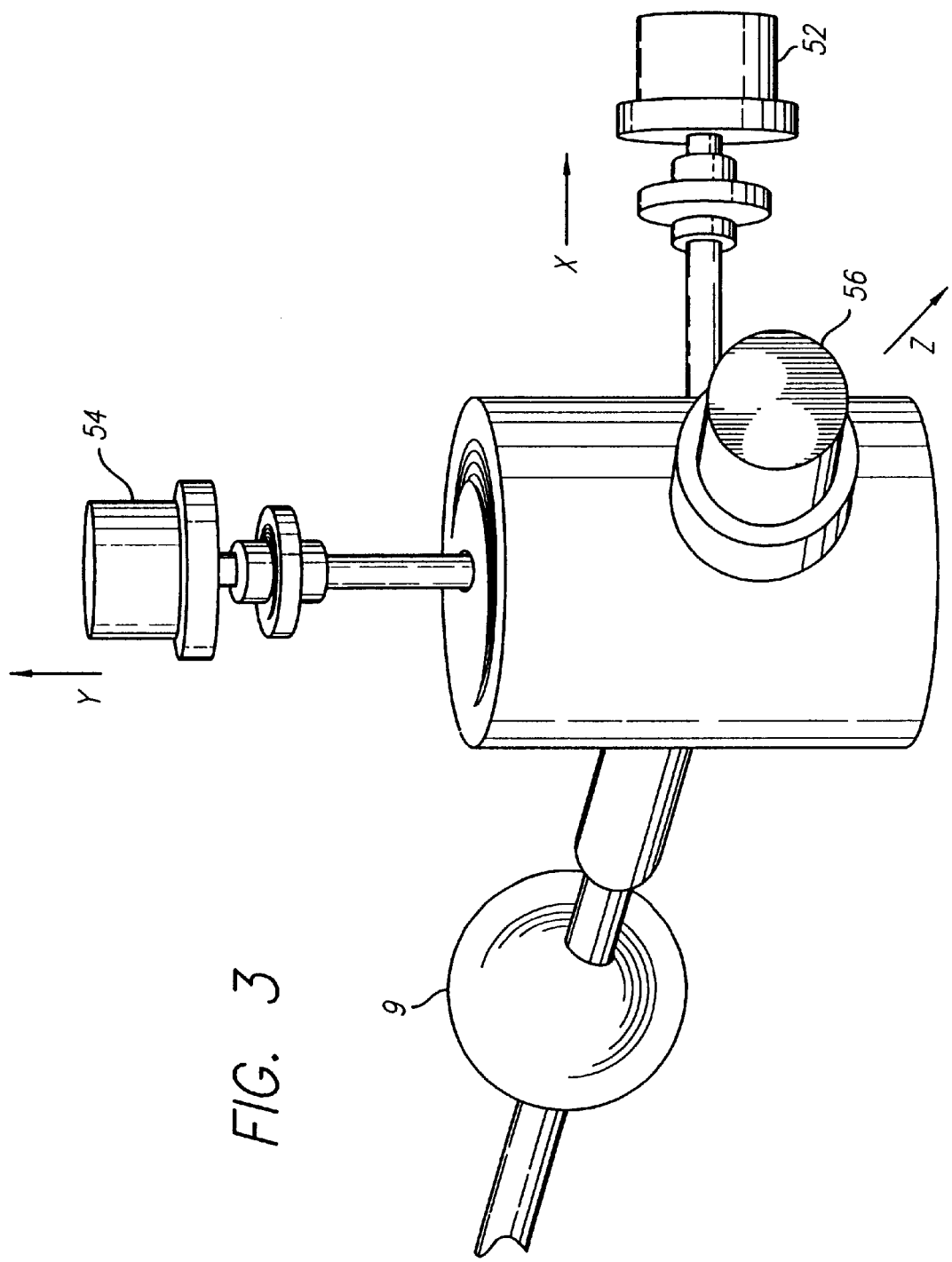
FIG. 3 is a block diagram of the preferred embodiment of the light source position controller of the present invention.

Referring first to FIG. 1, light generated by film projector 11 having a motorized lamp housing 18 such as the one disclosed and claimed in U.S. Pat. No. 5,054,909 issued to CHRISTIE INCORPORATED entitled LAMP HOUSING FOR MOTION PICTURE FILM PROJECTOR is radiated on a surface such as a movie screen 50. In the preferred embodiment, the film projector is fitted with a lamp position controller 15 which is comprised of three control means 52, 54 and 56, as shown in FIG. 3. The three control means 52, 54 and 56 move the lamp 9 relative to the fixed optical components such as the reflective mirror and the like. The first control means 56 drives a motor (not shown) that moves the lamp 9 so as to adjust the quality of the luminance distribution (i.e. the relative brightness of different areas on the screen). The second and third control means 54 and 52 move the lamp so as to adjust the horizontal and vertical positions of the luminance distribution on the screen 50.

Referring next to FIGS. 1 and 3, in the preferred embodiment the lamp is mounted in a housing 18 so that it is capable of moving along its longitudinal or Z axis. The lamp is attached to first control means 56 which controls the movement the lamp along its longitudinal or Z axis. The lamp housing 18 is attached to a second control means 54 which controls the motion of the lamp in a first lateral direction (up and down), herein designated as the Y axis. The lamp is also attached to a third control means 52 which is mounted on first control means 46, which controls the motion of the lamp in a second lateral direction (side-to-side), herein designated as the X axis.

Each of the control means are attached to a driver relay interface 48 which is capable of activating the control means 52, 54 and 56 in response to a control signal.

In order to determine luminance of screen 50 luminance, a light receiver 10, which produces a two dimensional optical image and a light detection means 20, is connected to an analyzer and control unit 12 ("ACU"). In the preferred embodiment, receiver 10 also comprises means for scanning the optical image and producing a varying voltage which corresponds to the light level at each pixel of the scanned image.

ACU 12 comprises means to capture and store individual image frames detected by receiver 10. It also comprises means to measure and store selected pixel values within a frame and means to average a number of pixel values within a selected area of an image. ACU 12 modifies the measured values as needed to correct for systemic errors, such as variations in sensitivity of the light receiver 10, and aberrations of projector lens 17 and the like.

Figure 4:
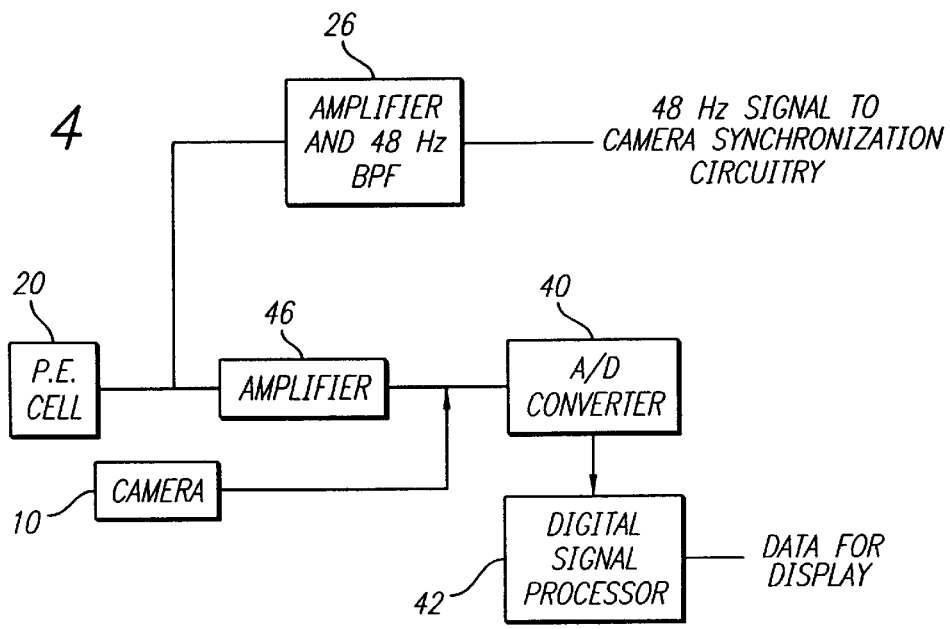
FIG. 4 is a block diagram of the ACU shown in FIG. 2.

In the preferred embodiment, ACU 12 comprises a digital signal processor 42 and an analog to digital converter 40, as shown in FIG. 4, in addition to memory and such other circuitry (not shown) and available software necessary to provide the signal analysis functions and interface functions set forth above for communications with the remainder of the system and the driver interface unit 48. In the preferred embodiment, such other circuitry may include, but is not limited to, a power supply, RS-232 drivers and receivers, communications specific software, and camera cable termination and receiving circuitry.

In the preferred embodiment, the light receiver 10 is a television camera, which is mounted on the back wall of the audience area or in the projection booth of a theater. In the preferred embodiment, the lens on the camera is a zoom lens which has at least a 4:1 zoom ratio. Lens 16 is mounted on the front of camera 10. Light detection means 20 comprises a photoelectric cell ("P.E.Cell") which detects light reflected from screen 50.

Figure 2:
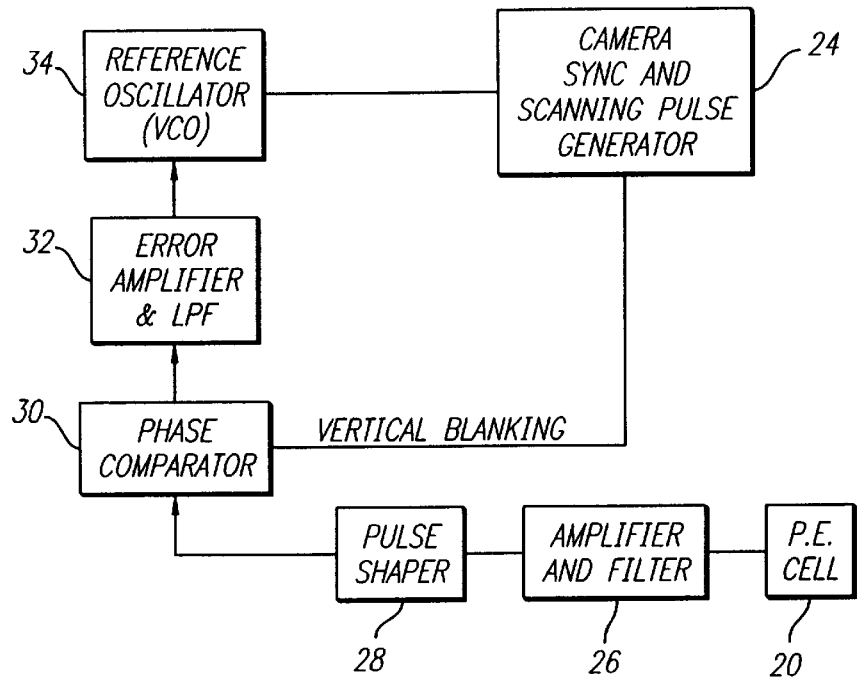
FIG. 2 is a block diagram of the preferred embodiment of the present invention.

Referring more specifically to FIG. 2, a block diagram of a portion of the components of the preferred embodiment of the light receiver 10 is shown. In order that each light pulse emitted from the projector will be entirely captured by a field scan of the light receiver 10, in the preferred embodiment, the receiver 10 comprises components that synchronize the field scan and the pulse train of the light source. Thus, in the preferred embodiment of the present invention, the receiver 10 is able to scan the screen 50 at the same rate and phase as the light pulses emitted by the projection equipment.

As shown in FIG. 2, receiver 10 contains a sync and scanning pulse generator 24 which determines the rate and phase of each field scan of the receiver 10. While TV cameras, such as the one used in the preferred embodiment, usually employ crystals as their timing reference, in the system of the present invention, the crystal has been replaced by a reference oscillator 34 as the basic timing for the sync generator 24 which facilitates the ability of the camera to be locked in the same phase as the projector.

Specifically, the photocell 20 in the camera circuit shown in FIG. 4, requires some signal conditioning to synchronize it to the pulse rate of the light source (i.e. the shutter blade of the projector) so that the CCD camera 10, in the camera circuit, doesn't see a flickering (i.e. pulsing) light image.

In operation, in order that synchronization may be achieved, after photoelectric cell 20 in FIGS. 2 and 4 detects the light pulses reflected from screen 50, it converts them into signals which are fed into amplifier and filter means 26. Amplifier and filter means 26 has a frequency response that is sharply peaked at the frequency of the light pulse train emitted from the light source, in order to provide gain and to discriminate against light variations at other frequencies.

In the preferred embodiment, amplifier and filter means is sharply peaked at 48 Hz and can discriminate against light variations at frequencies such as 60 Hz and 120 Hz.

Amplifier and filter 26 cleanses the signal by filtering out any noise components and amplifies the converted filtered signals into an essentially sinusoidal wave representing the projector light pulses that are detected on the screen.

In order to achieve optimal synchronization, in the preferred embodiment, the output of the amplifier and filter 26 is fed into a pulse shaper 28. Pulse shaper 28 converts the essentially sinusoidal output into a square wave according to the requirements of phase comparator 30, which is utilized to continually monitor the phase comparison of the signals generated by the photoelectric cell 20 and the camera sync and scanning pulse generator 24.

If a phase difference is detected, the phase comparator 30 generates an error signal which is amplified by error amplifier and filter 32. Thereafter, the amplified and filtered error signal is fed into the reference oscillator 34 so that it will vary the phase and/or frequency of the reference oscillator 34 until the signal produced by sync generator 24 is phased locked at the same rate and phase as the light pulses generated by the projector.

Thus, when each light pulse of a 48 Hz train is emitted from the projector, it will be entirely captured by a field scan of the camera 10.

While in the preferred embodiment the light receiver 10 is synchronized with the light pulses reflecting off the screen 50, the ACU 12 also can be used effectively without the light receiver 10 being synchronized with the light pulses. If synchronism does not exist, the light receiver 10 will also detect the time period between the light pulses. Thus, the luminance readings will vary whenever the phase of the light receiver 10 and the phase of the light pulses are out of sync. Peak readings would have to be made and the measurement process would be much slower.

Referring again to FIG. 4 the analyzer and interface unit ("ACU") 12 of FIG. 1 is shown in part connected to the photoelectric cell 20 of receiver 10 through amplifier 46. Due to this connection, the ACU 12 is able to analyze the light pulses detected by the photoelectric cell 20.

When the screen luminance is to be measured, the projector and lamp are operated normally, except that the projector does not contain any film. The extremely high amount of energy generated by the lamp will heat the projection lens and may fracture it. Therefore, any adjustment to the lighting source must be made quickly with the adjustments for all three axes being made concurrently.

The TV camera is mounted on the rear wall of the audience area of the theater and the zoom lens is set so that the camera over scans the theater screen. The processing electronics in the ACU 12 detects the horizontal and vertical edges of the screen in the camera image by constructing a histogram of the luminance values for the entire image. The histogram will detect two areas where the occurrence of the luminance values are concentrated—the "dark" area, in which the luminance values represent image information from the low reflectance area outside the screen boundary and the "light" area, where the luminance values represent image information from the illuminated screen. The ACU then spatially analyzes the data to determine the screen boundaries and to determine the luminance distribution on the screen.

Specifically, an artificial border is established within the screen image that is preferably 5–10% smaller than the screen image in order to disregard any severe light variations that may occur near the edges of the screen. All luminance measurements are made within these artificial borders.

The portion of the screen image within the artificial borders is divided into a selectable number of measurement points. In the preferred embodiment there are nine points located at predetermined distances from the screen border and the screen center—center, center top, center bottom, left, left top, left bottom, right, right top and right bottom. These measurement points are assigned an average reference value according to their prior measured illumination intensities.

The ACU analyzes the screen luminance pattern by measuring the voltage of each pixel detected by the camera against a reference voltage which is the voltage produced by a black level. Once this analysis is complete, the ACU sends a signal to the control means in the lamp housing.

To adjust the luminance distribution so that it can be centered on the screen, the focus control means 56 in the lamp housing is adjusted until the luminance pattern shows significant darkening around the edges. Thereafter, the first moments of luminance of each of the scan lines repeatedly are taken horizontally and vertically and then averaged to determine the horizontal and vertical location of the brightest area of the luminance pattern. This location is compared to the known actual physical center of the screen rectangle such that a error signal is sent to the second and third control means to drive the X and Y motors in the lamp housing. This process is repeated until the luminance pattern is centered on the screen and there is only a slight falloff in luminance (25% or less) near the corners of the screen.

To control the quality of the luminance, the system measures two parameters—the total luminance (i.e. the total of all luminance values for the screen) and the corner to center ratio (i.e. the average luminance in the corner regions of the screen divided by the total average luminance in the center of the screen.)

A reference value is determined by a weighted average of the total luminance and corner to center ratio. The luminance distribution is adjusted by moving the focus motor until a very flat luminance distribution is achieved. The motor is then in the direction that produces progressively brighter and less flat luminance distributions. During this period, the reference value continuously is evaluated and compared with previous reference values to locate a peak value. Once the peak value is ascertained, the location of the lamp for the optimal luminance distribution also has been obtained.

The centering and luminance distribution processes are somewhat user adjustable. For example, for image centering, the user can select a vertical offset to the nominal center location, to allow for differences between the point of view of the light receiver 10 and the actual position of the movie audience when they are viewing a screen with directional reflective characteristics. In addition, depending upon user preferences, the user can choose between several settings to maximize either the brightness or luminance distribution on the screen or to account for variations in projection angles and/or surface gain.

The software in the ACU 12 contains predetermined compliance criteria that must be satisfied to terminate the system operation. If the criteria are not satisfied a predetermined amount of times, the system will time-out, requiring the user to restart the software or physically reevaluate the system.

Each frame of the camera comprises two fields. The lines in each field alternate in position and then are interlaced by the signal processor to comprise the entire frame. Thereafter, each frame of the scanned TV signal is stored in a memory buffer as voltage values with respect to the light that strikes it. The processing computer then utilizes a correction table to compensate for systemic errors. Thus, the system is able to compensate for such things as the fall off of the lens and variation of the sensitivity of the CCD element itself.

Thus, the system and method of the present invention is able to accurately and rapidly measure and adjust the luminance and the variation of the luminance across the screen. However, other applications are contemplated such as its use in X-Ray, video projection, high intensity light curing systems, semiconductor processing systems and other medical equipment in which a light source is focused on an object or surface.

While particular embodiments and techniques of the present invention have been shown and illustrated herein, it will be understood that many changes, substitutions and modifications may be made by those persons skilled in the art. It will be appreciated from the above description of presently preferred embodiments and techniques that other configurations and techniques are possible and within the scope of the present invention. Thus, the present invention is not intended to be limited to the particular embodiments and techniques specifically discussed hereinabove.

What is claimed is:

1. A system for automatically and quickly adjusting the luminance and luminance distribution of a light source on the surface of an object, comprising:

lighting means having a longitudinal axis, a first and a second axis, said lighting means projecting light on the surface and being capable of moving along said longitudinal, first and second axes, first control means connected to said lighting means for moving said lighting means in said first direction, second control means connected to said lighting means for moving said lighting means in said second lateral direction, third control means connected to said lighting means for moving said lighting means along its longitudinal axis;

driver means for selectively powering either one or more of said first, second and third control means concurrently in response to control signals so as to change the position and intensity of said lighting means;

means for receiving said light comprising means for scanning the surface and producing a signal which corresponds to the luminance of the scanned surface image;

means to detect the luminance distribution of said light on the surface;

means to analyze, capture and store individual optical signals connected to said receiving means, whereby said analyzing means measures and stores the value of the luminance and the luminance distribution on the surface;

error correction means for modifying the stored values to correct for system errors, means for generating said control signals in response to the corrected values, whereby said control signals activate said first, second and third control means repeatedly as needed to adjust the position of said lighting means until optimal brightness and luminance distribution across the surface is achieved.

2. The system of claim 1 wherein said first control means comprises a motor for moving said lighting means in said first direction, and said second control means comprises a motor for moving said lighting means in said second direction.

3. The system of claim 1 wherein said analyzing and control means provides means for compensating for the difference in the vertical angle between said receiving means to the surface light path and the vertical angle between surface to the actual viewing area.

4. The system of claim 1 wherein said analyzing and control means further comprises means for measuring and adjusting the ratio of luminance in the corners of the viewing surface to the luminance at the center of the surface.

5. The system of claim 1 further comprising means for adjusting the vertical centering of the light on the surface.

6. The system of claim 1 further comprising:

means for detecting the luminance at the edges of the surface;

means for detecting the luminance at the center of the surface; and means for adjusting the luminance at the edges of the surface in relation to the luminance at the center of the surface.

7. The system of claim 1 wherein said receiving means comprises means for producing a two dimensional optical image of the surface and for converting the surface image into a signal having a phase and frequency, said receiving means comprising means for scanning the surface and producing a varying voltage which corresponds to the luminance of the scanned surface image.

8. A system for automatically adjusting the luminance and luminance distribution of a projector projecting light onto a surface, comprising:

a light source having a longitudinal axis, a first axis and a second axis, said light source projecting light on a surface and being capable of automatically moving along said longitudinal, first and second axes within the projector, first control means connected to said light source for moving said light source in said first direction relative to said projector optics, second control means connected to said light source for moving said light source in said second direction;

third control means connected to said light source for moving said light source along its longitudinal axis;

driver means for selectively powering said first, second and third control means in response to control signals so as to change the position of said light source;

means for detecting light projected by said light source on said surface;

analyzer and control means connected to said detecting means comprising:

means for detecting the edges of said surface;

means for measuring the light projected onto a plurality of predetermined locations on said surface;

means for recording the relative value of said light projected on said plurality of locations;

means for generating said control signals to drive said driver means so as to adjust said light source in said longitudinal, and said first and second axes concurrently and quickly; and means for continuously updating the relative value of said light projected onto said plurality of locations, until the desired luminance distribution is achieved.

9. The system of claim 8 wherein said first control means comprises a motor for moving said light source in said first direction, and said second control means comprises a motor for moving said light source in said second direction.

10. The system of claim 8 wherein said driver means comprises switch means for powering each of said control means to selectively move said light source along said longitudinal axis, along said first axis, and along said second axis, concurrently.

11. The system of claim 8 further comprising means for adjusting the vertical centering of the light projected onto the surface.

12. The system of claim 8 further comprising:
means for detecting the luminance at the edges of the surface;
means for detecting the luminance at the center of the surface; and
means for adjusting the luminance at the edges of the surface in relation to the luminance at the center of the surface.

13. The system of claim 8 wherein said analyzing and control means provides means for compensating for the difference in the vertical angle between the receiving means to the surface light path and the vertical angle between the surface to the actual viewing area.

14. The system of claim 8 wherein said analyzing and control means further comprises means for measuring and adjusting the ratio of luminance in the corners of the viewing surface to the luminance at the center of the surface.

15. A method for measuring and optimizing the luminance and luminance distribution across the surface of an object, comprising the steps of:
projecting light pulses at the surface of the object;
scanning the surface of the object in various areas;
detecting the luminance of the surface in said various areas generated during each scan;
analyzing the luminance of each of the areas of the surface during each scan using the area of the surface containing the brightest luminance as a point of reference; and
quickly moving the source of the light pulses concurrently in the longitudinal, horizontal and vertical directions relative to the optics until optimal luminance distribution is achieved on the surface.

16. The method of claim 15 further comprising the steps of compensating for the difference in the vertical angle between the lighting receiver to surface light path and the vertical angle between surface to the actual viewing area.

17. The method of claim 15 further comprising the steps of measuring and adjusting the ratio of luminance in the corners of the viewing surface to the luminance at the center of the surface.

18. A system for automatically and quickly adjusting the luminance and luminance distribution of a light source on the surface of an object, comprising:
a lamp having a longitudinal axis, a first and a second axis, said lamp projecting light on the surface and being capable of moving along said longitudinal, first and second axes,
first control means connected to said lamp for moving said lamp in said first direction,
second control means connected to said lamp for moving said lamp in said second direction,
third control means connected to said lamp for moving said lamp along its longitudinal axis;
driver means for selectively powering either one or more of said first, second and third control means concurrently in response to control signals so as to change the position and intensity of said lamp;
means for receiving said light comprising means for scanning the surface and producing a signal which corresponds to the luminance of the scanned surface image;
means to detect the luminance distribution of said light on the surface;
means to analyze, capture and store individual optical signals connected to said receiving means, whereby said analyzing means measures and stores the value of the luminance and the luminance distribution on the surface;
error correction means for modifying the stored values to correct for system errors;
means for generating said control signals in response to the corrected values, whereby said control signals activate said first, second and third control means repeatedly as needed to adjust the position of said lamp until optimal brightness and luminance distribution across the surface is achieved.

19. A system for automatically and quickly adjusting the luminance and luminance distribution of a light on the surface of a movie screen, comprising:
a lamp having a longitudinal axis, a first and a second axis, said lamp projecting light during short fixed intervals on the screen and being capable of moving along said longitudinal axis,
first control means connected to said lamp for automatically moving said lamp in said first direction in response to a control signal,
second control means connected to said lamp for moving said lamp in said second direction in response to said control signal,
third control means connected to said lamp for moving said lamp along its longitudinal axis in response to said control signal;
means for receiving said light comprising means for scanning the surface and producing an optical signal which corresponds the luminance of the scanned surface image;
means to detect the luminance distribution of said light on the surface during each scan;
means to analyze, capture and store individual optical signals connected to said receiving means, whereby said analyzing means measures and stores the value of the luminance and the luminance distribution on the surface during each scan;
error correction means for modifying the stored values to correct for system errors;
means for generating said control signals in response to the corrected values, whereby said control signals activate either one or more of said first, second and third control means concurrently as needed so as to control and adjust the position and intensity of said lamp until optimal brightness and luminance distribution across the surface is achieved.

* * * * *